(12) United States Patent
Song et al.

(10) Patent No.: US 11,447,393 B2
(45) Date of Patent: Sep. 20, 2022

(54) GRAPHENE AND METHOD FOR PREPARING SAME

(71) Applicant: Research & Business Foundation Sungkyunkwan University, Suwon-si (KR)

(72) Inventors: Young Jae Song, Suwon-si (KR); Bong Gyu Shin, Suwon-si (KR); Sang Woo Park, Suwon-si (KR); Dae Hwan Boo, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 335 days.

(21) Appl. No.: 16/747,873

(22) Filed: Jan. 21, 2020

(65) Prior Publication Data
US 2020/0156947 A1      May 21, 2020

Related U.S. Application Data

(63) Continuation of application No. PCT/KR2018/008127, filed on Jul. 18, 2018.

(30) Foreign Application Priority Data

Jul. 21, 2017   (KR) .................. 10-2017-0092874

(51) Int. Cl.
   *C01B 32/188*   (2017.01)
(52) U.S. Cl.
   CPC .................. *C01B 32/188* (2017.08)
(58) Field of Classification Search
   CPC . C01B 32/188; C01B 2204/02; C01B 32/184; C01B 32/194; C01B 32/182; C01B 32/198; C01B 2204/00; C01B 2204/04; C01B 2204/06; C01B 2204/20; C01B 2204/22; C01B 2204/24; C01B 2204/26; C01B 2204/28; C01B 2204/30; C01B 2204/32; C01B 32/20; C01B 32/205; C01B 32/21; C01B 32/215; C01B 32/22; C01B 32/225; C01B 32/23; C01B 2204/065; C30B 29/06; C30B 29/36; C30B 29/68; C30B 33/02
   See application file for complete search history.

(56) References Cited

FOREIGN PATENT DOCUMENTS

| KR | 10-0923304 B1 | 10/2009 |
|---|---|---|
| KR | 10-2013-0006869 A | 1/2013 |
| KR | 10-2015-0047048 A | 5/2015 |

OTHER PUBLICATIONS

Lukosius, et al., Metal-Free CVD Graphene Synthesis on 200 mm Ge/Si(001) Substrates, ACS Appl. Mater. Interfaces 2016; 8: 33786-33793 (Year: 2016).*
Yamamoto, et al., Low threading dislocation density Ge deposited on Si (100) using RPCVD, Solid-State Electronics 2011; 60: 2-6 (Year: 2011).*

(Continued)

*Primary Examiner* — Daniel C. McCracken
(74) *Attorney, Agent, or Firm* — NSIP Law (57) ABSTRACT

The present disclosure relates to a method for preparing graphene, including: forming a dielectric material; and applying heat treatment concurrently with a gaseous carbon source on the dielectric material to grow.

18 Claims, 5 Drawing Sheets

FORM DIELECTRIC MATERIAL HAVING CRYSTALLINITY — S100

PREPARE GRAPHENE BY MEANS OF HEAT TREATING WHILE ADDING GASEOUS CARBON SOURCE ON DIELECTRIC MATERIAL — S200

(56) References Cited

OTHER PUBLICATIONS

International Search Report dated Oct. 17, 2018 in counterpart International Patent Application No. PCT/KR2018/008127 (2 pages in English and 2 pages in Korean).
Korean Office Action dated Jul. 10, 2018 in corresponding Korean Patent Application No. 10-2017-0092874 (7 pages in Korean).
Vélez-Fort et al., "Towards single step fabrication of N-doped graphene/$Si_aN_4$/SiC heterostructures," Tsinghua University Press 2014, Nano Research, 26 pages.
Masuda et al., "Formation of a nitride interface in epitaxial graphene on SiC (0001)," Physical Review B 91, 075421 (2015), 33 pages.
Sirikumara et al., "Buffer-eliminated, charge-neutral epitaxial graphene on oxidized 4H-SiC (0001) surface," Journal of Applied Physics 119, 215305 (2016), 6 pages.

* cited by examiner

Time-dependent Raman Spectroscopy

Time-dependent XPS

FIG. 5

SiON-SiC

Graphene/SiON-SiC

GRAPHENE AND METHOD FOR PREPARING SAME

CROSS-REFERENCE TO RELATED APPLICATIONS

This application is a continuation of International Application No. PCT/KR2018/008127 filed on Jul. 18, 2018, which claims the benefit of Korean Patent Application No. 10-2017-0092874 filed on Jul. 21, 2017, in the Korean Intellectual Property Office, the entire disclosures of which are incorporated herein by reference for all purposes.

BACKGROUND

1. Field

The following description relates to graphene and a method for preparing the same.

2. Description of Related Art

Graphene is a two-dimensional carbonaceous material and has an ultrathin film structure made up of a hexagonal honeycomb-shaped single layer of carbon atoms. Graphene is a material with the most excellent properties, such as strength, thermal conductivity, electron mobility, etc., among the existing materials and has attracted a lot of attention as a core material applicable to various fields such as display, secondary battery, solar battery, light emitting device, catalyst, and sensor.

Graphene is known as having a high electron mobility of from about 20,000 $cm^2$/Vs to about 50,000 $cm^2$/Vs. Above all, carbon nanotubes, which are similar to graphene, have a very low yield through a process including synthesis and purification. Therefore, even if carbon nanotubes are synthesized using a cheap material, final products are expensive, whereas graphite is very cheap. Further, single-walled carbon nanotubes have metallic or semiconductor properties depending on chirality and diameter. Even if single-walled carbon nanotubes have the same semiconductor properties, they are all different from each other in band gap. Therefore, in order to use a specific semiconductor property or metallic property of given single-walled carbon nanotubes, each of the single-walled carbon nanotubes needs to be separated, but such a process is known as being very difficult.

On the other hand, graphene has electrical properties that vary depending on crystal directionality of graphene of a given thickness, and, thus, a user can exhibit an electrical property into its selected direction. Therefore, graphene can be very effectively used in devices or carbon-based electromagnetic devices.

A metal catalyst has been mainly used to obtain large-area graphene. However, when graphene obtained using a metal catalyst is applied to an electronic and optical device, it may be contaminated, torn, or wrinkled while being transferred to a dielectric substrate and thus may cause degradation of the device. Also, graphene may lose its inherent properties due to the surface roughness and chemical defects (chemical contamination) of a substrate used for application or the presence of dangling bonds. Further, direct growth on metal makes it difficult to control the crystallinity of the substrate, and, thus, it is difficult to obtain monocrystalline graphene of large area at a wafer level.

An example of the background technology of the present disclosure is Korean Patent No. 10-0923304 which relates to a graphene sheet and a process for preparing the same. However, the above-described patent is limited to a method for preparing graphene of large area by using a metal catalyst, but does not describe direct large area growth on a dielectric material and a method for preparing a monocrystalline atomic monolayer of graphene.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for preparing graphene, includes: forming a dielectric material having crystallinity; and applying heat treatment concurrently with a gaseous carbon source on the dielectric material to grow.

The graphene may be grown by direct growth based on the crystallinity on the dielectric material having crystallinity, but may not be limited thereto.

The dielectric material having crystallinity may be formed on a substrate, but may not be limited thereto.

The substrate may contain a material selected from the group consisting of silicon carbide, silicon, germanium, silicon germanium, InAs, AlAs, GaAs, InP, GaN, InGaAs, InAlAs, GaSb, AlSb, AlP, GaP and combinations thereof, but may not be limited thereto.

The process of forming the dielectric material having crystallinity may be performed by exposing the substrate to a gas selected from the group consisting of hydrogen, nitrogen, oxygen, air, silicon and combinations thereof, but may not be limited thereto.

The process of forming the dielectric material having crystallinity may be performed under a pressure of $10^{-9}$ Torr to 1,000 Torr, but may not be limited thereto.

The process of forming the dielectric material having crystallinity may be performed at a temperature of 300° C. to 1,700° C., but may not be limited thereto.

The dielectric material may include silicon nitrogen oxide or surface hexagonal lattice silica, but may not be limited thereto.

The silicon nitrogen oxide may include SiON or $Si_2N_2O$, but may not be limited thereto.

The surface hexagonal lattice silica may include $Si_2O_5$ or $SiO_2$, but may not be limited thereto.

The gaseous carbon source may include a carbon-containing compound having 1 to 7 carbon atoms, but may not be limited thereto.

The gaseous carbon source may include a material selected from the group consisting of methane, ethane, ethylene, carbon monoxide, ethanol, acetylene, propane, propylene, butane, butadiene, pentane, pentene, cyclopentadiene, hexane, cyclohexane, benzene, toluene and combinations thereof, but may not be limited thereto.

The heat treatment may be performed at a temperature of 300° C. to 1,700° C., but may not be limited thereto.

The method may further include supplying hydrogen before the process of forming the dielectric material on the substrate, but may not be limited thereto.

The method may further include cooling a product of the heat treatment, but may not be limited thereto.

A second aspect of the present disclosure provides a graphene sheet prepared by the method for preparing graphene.

The graphene sheet may be monocrystalline, but may not be limited thereto.

Other features and aspects will be apparent from the following detailed description, the drawings, and the claims.

BRIEF DESCRIPTION OF THE DRAWINGS

(A) of FIG. 3 is an example of a growth diagram of prepared graphene.

(B) of FIG. 3 is an example of a low energy electron diffraction (LEED) pattern showing the crystallinity on the surface of SiON—SiC before the graphene is grown.

(C) of FIG. 3 is an example of an LEED pattern showing the crystallinity of graphene grown on the SiON—SiC.

(D) of FIG. 3 is an example of a structure of the surface of the SiON—SiC.

(E) of FIG. 3 is an example of a structure of the surfaces of the SiON—SiC and the graphene.

(F) and (G) of FIG. 3 are examples of lateral structures before and after the graphene is grown, respectively.

(A) and (B) of FIG. 4 are examples of Raman spectra graphs of prepared graphene.

(C) and (D) of FIG. 4 are examples of X-ray photoemission spectroscopy (XPS) graphs of prepared graphene.

(A) and (B) of FIG. 5 are examples of scanning tunneling microscopy (STM) images.

(C) of FIG. 5 is an example of a scanning tunneling spectroscopy (STS) graph of a SiON—SiC substrate prepared.

(D) to (F) of FIG. 5 are examples of STM images.

(G) of FIG. 5 is example of an STS graph of graphene.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Hereafter, graphene and a method for preparing the same according to the present disclosure will be described in detail with reference to embodiments, examples, and the accompanying drawings. However, the present disclosure may not be limited to the following embodiments, examples, and drawings.

A first aspect of the present disclosure relates to a method for preparing graphene, including: forming a dielectric material having crystallinity; and preparing graphene by means of heat treating while adding a gaseous carbon source on the dielectric material.

According to the above-described means for solving the problems, the method for preparing graphene of the present disclosure can produce monocrystalline and monolayer graphene of a large area on the surface of a dielectric material by direct growth without a catalytic metal. Since the graphene can be grown directly on the dielectric material without a catalytic metal, it does not need to be transferred to another substrate and can be applied to a device right away. Also, it is possible to suppress contamination, tears, or wrinkles of the graphene which may occur during the transfer. Thus, the graphene can retain its inherent properties.

Meanwhile, direct growth of graphene on metal makes it difficult to control the crystallinity of a substrate. Thus, it is difficult to obtain monocrystalline graphene. However, graphene according to the present disclosure is grown by direct growth on a dielectric material having crystallinity, and, thus, it is possible to obtain monocrystalline graphene.

Also, the graphene can be prepared depending on the size of a substrate on which a dielectric material having crystallinity is to be formed. Thus, it is possible to grow large-area graphene.

Since the crystal orientation of the graphene is determined by the direction of the crystallinity of the dielectric material, the crystal orientation of the graphene can be previously determined by an atomic lattice structure on the surface of the substrate.

The graphene can be grown to a single atomic layer without being stacked even if the growth time of the graphene increases due to self-limiting effect. For this reason, it is possible to obtain a single atomic layer of graphene regardless of the growth time of graphene. The single atomic layer of graphene does not have a contact resistance between graphene and thus has excellent electrical properties.

Figure 1:
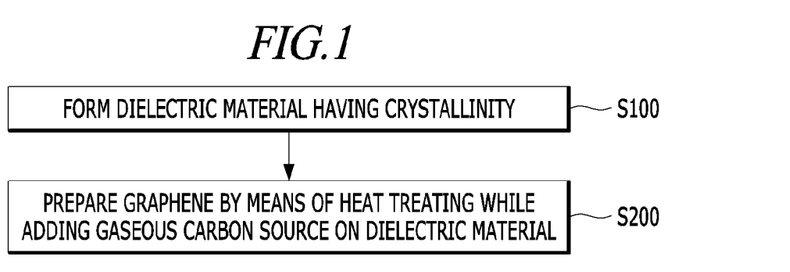
FIG. 1 is a flowchart showing an example of a method for preparing graphene.

FIG. 1 is a flowchart showing an example of a method for preparing graphene.

First, a dielectric material having crystallinity is formed (S100).

According to an embodiment of the present disclosure, the dielectric material having crystallinity may be formed on a substrate, but may not be limited thereto.

According to an embodiment of the present disclosure, the substrate may contain a material selected from the group consisting of silicon carbide, silicon, germanium, silicon germanium, InAs, AlAs, GaAs, InP, GaN, InGaAs, InAlAs, GaSb, AlSb, AlP, GaP and combinations thereof, but may not be limited thereto.

The substrate may have crystallinity, but may not be limited thereto.

The crystallinity may have (0001) orientation, but may not be limited thereto.

According to an embodiment of the present disclosure, the process of forming the dielectric material having crystallinity may be performed by exposing the substrate to a gas selected from the group consisting of hydrogen, nitrogen, oxygen, air, silicon and combinations thereof, but may not be limited thereto.

According to an embodiment of the present disclosure, the process of forming the dielectric material having crystallinity may be performed under a pressure of from $10^{-9}$ Torr to 1,000 Torr, but may not be limited thereto.

According to an embodiment of the present disclosure, the process of forming the dielectric material having crystallinity may be performed at a temperature of from 300° C. to 1,700° C., but may not be limited thereto.

According to an embodiment of the present disclosure, the dielectric material may include silicon nitrogen oxide or surface hexagonal lattice silica, but may not be limited thereto.

According to an embodiment of the present disclosure, the silicon nitrogen oxide may include SiON or $Si_2N_2O$, but may not be limited thereto.

According to an embodiment of the present disclosure, the surface hexagonal lattice silica may include $Si_2O_5$ or $SiO_2$, but may not be limited thereto.

According to an embodiment of the present disclosure, the method may further include supplying hydrogen before the process of forming the dielectric material on the substrate, but may not be limited thereto.

The supplied hydrogen can be used to control a gas phase reaction by keeping the surface of the substrate clean.

Then, graphene is prepared by means of heat treating while adding a gaseous carbon source on the dielectric material (S200).

According to an embodiment of the present disclosure, the graphene may be grown by direct growth depending on the crystallinity on the dielectric material having crystallinity, but may not be limited thereto.

Since the graphene can be grown directly on the dielectric material having crystallinity without a catalytic metal, it does not need to be transferred to another substrate and can be applied to a device right away. Also, it is possible to suppress contamination, tears, or wrinkles of the graphene which may occur during the transfer. Thus, the graphene can retain its inherent properties.

In general, direct growth of graphene on metal makes it difficult to control the crystallinity of a substrate. Thus, it is difficult to obtain monocrystalline graphene. However, the graphene described above is grown by direct growth on the dielectric material having crystallinity, and, thus, it is possible to obtain monocrystalline graphene.

Conventional graphene is polycrystalline and thus shows considerably lower electrical and mechanical properties than theoretical properties expected when graphene is monocrystalline. However, it is possible to obtain monocrystalline graphene according to the present disclosure. Thus, the graphene according to the present disclosure shows the inherent electrical and mechanical properties of graphene.

The graphene can be prepared depending on the size of a substrate on which the dielectric material having crystallinity is to be formed. Thus, it is possible to grow large-area graphene.

According to an embodiment of the present disclosure, the gaseous carbon source may include a carbon-containing compound having 1 to 7 carbon atoms, but may not be limited thereto.

According to an embodiment of the present disclosure, the gaseous carbon source may include a material selected from the group consisting of methane, ethane, ethylene, carbon monoxide, ethanol, acetylene, propane, propylene, butane, butadiene, pentane, pentene, cyclopentadiene, hexane, cyclohexane, benzene, toluene and combinations thereof, but may not be limited thereto.

Carbon may be supplied as the carbon source, and a material that can be present in a gas phase at a temperature of 300° C. or more may be used as the carbon source.

According to an embodiment of the present disclosure, the heat treatment may be performed at a temperature of from 300° C. to 1,700° C., but may not be limited thereto.

A heat source for the heat treatment may include one selected from the group consisting of Joule heating, induction heating, radiation heat, laser, infrared radiation, microwaves, plasma, ultraviolet radiation, surface Plasmon heating and combinations thereof, but may not be limited thereto.

According to an embodiment of the present disclosure, the method may further include cooling a product of the heat treatment, but may not be limited thereto.

The graphene may be grown uniformly and arranged regularly through the process of cooling, but may not be limited thereto.

In the process of cooling, rapid cooling may cause cracks in a graphene sheet to be prepared. Therefore, cooling may be performed slowly at a constant speed if possible, for example, at a speed of from 0.1° C. to 10° C. per minute, and natural cooling or other methods can be used. The natural cooling is performed simply by removing a heat source used for the heat treatment. It is possible to obtain a sufficient cooling speed just by removing the heat source.

The graphene can be a single atomic layer of graphene, but may not be limited thereto.

The graphene can be grown to a single atomic layer without being stacked even if the growth time of the graphene increases due to self-limiting effect. For this reason, it is possible to obtain a single atomic layer of graphene regardless of the growth time of graphene.

The single atomic layer of graphene does not have a contact resistance between graphene and thus has excellent electrical properties. A second aspect of the present disclosure provides a graphene sheet prepared by the method for preparing graphene.

The graphene sheet may be formed of polycyclic aromatic molecules in which multiple carbon atoms are covalently bound to each other, but may not be limited thereto.

According to an embodiment of the present disclosure, the graphene sheet may be monocrystalline, but may not be limited thereto.

Hereinafter, the present disclosure will be described in more detail with reference to examples. The following examples are provided only for explanation, but do not intend to limit the scope of the present disclosure.

In an example, a silicon carbide (SiC(0001)) substrate was washed with acetone and isopropyl alcohol.

Figure 2:
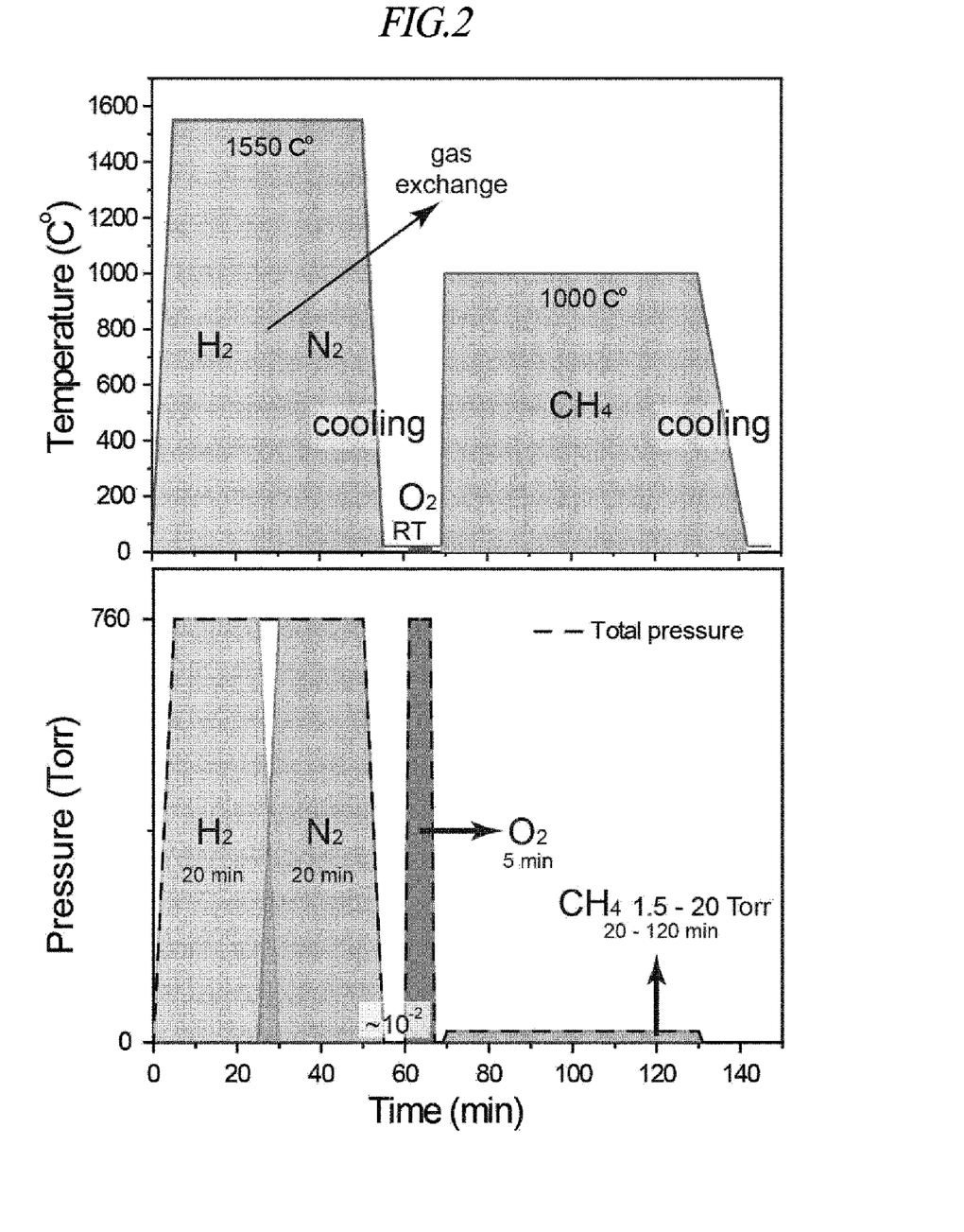
FIG. 2 shows graphs of the temperature of a sample and the pressure of a gas over time in a method for preparing graphene according to an example of the present disclosure.

FIG. 2 shows graphs of the temperature of a sample and the pressure of a gas over time in a method for preparing graphene according to an example of the present disclosure.

Then, a hydrogen gas was supplied on the silicon carbide substrate under 760 Torr at 1,550° C. for 20 minutes.

After the silicon carbide substrate was etched with the hydrogen gas, a nitrogen gas was supplied under 760 Torr at 1,550° C. for 20 minutes.

After the nitrogen gas was supplied, the silicon carbide substrate was cooled to room temperature (25° C.) under a pressure of $10^{-3}$ Torr.

An oxygen gas was supplied on the nitrogen-supplied silicon carbide substrate under 760 torr at room temperature (25° C.) for 5 minutes to prepare an SiON—SiC(0001) substrate.

A heat treatment was performed to the SiON—SiC(0001) substrate for 1 hour while methane was supplied on the SiON—SiC(0001) substrate under 1.5 Torr to 20 Torr at 1,000° C. to grow graphene.

Figure 3:
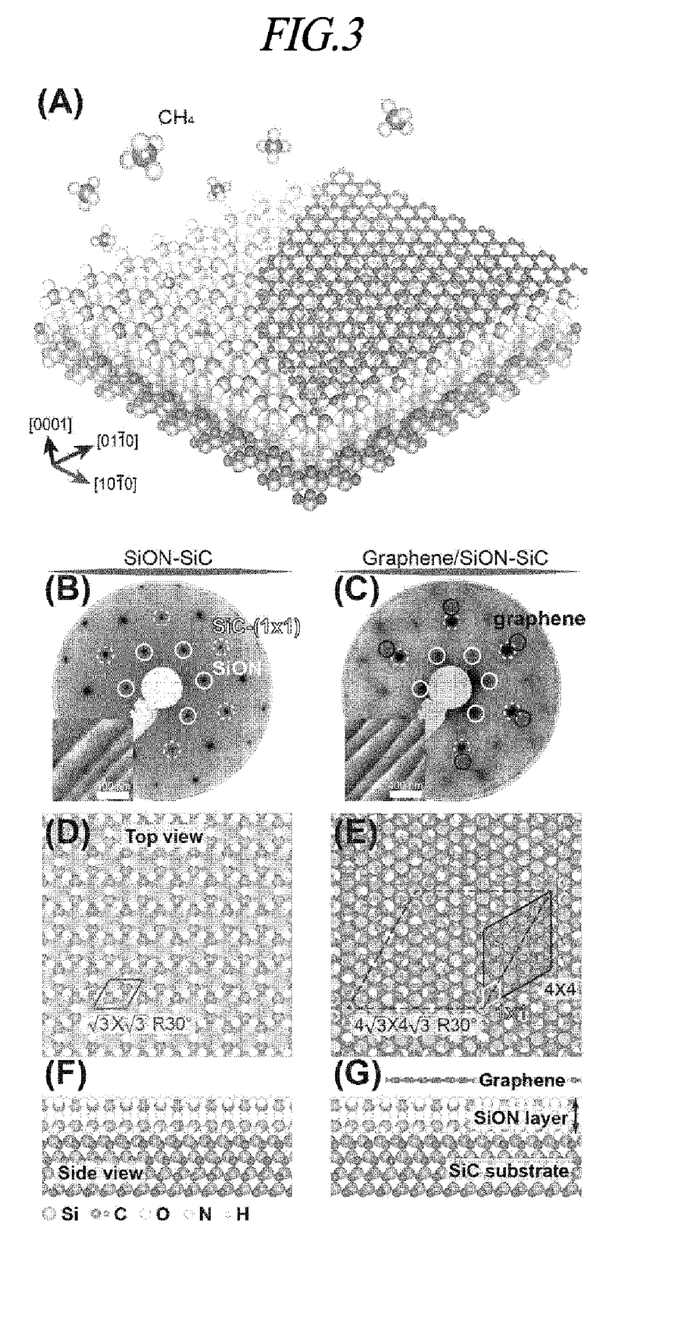
Figure 4:
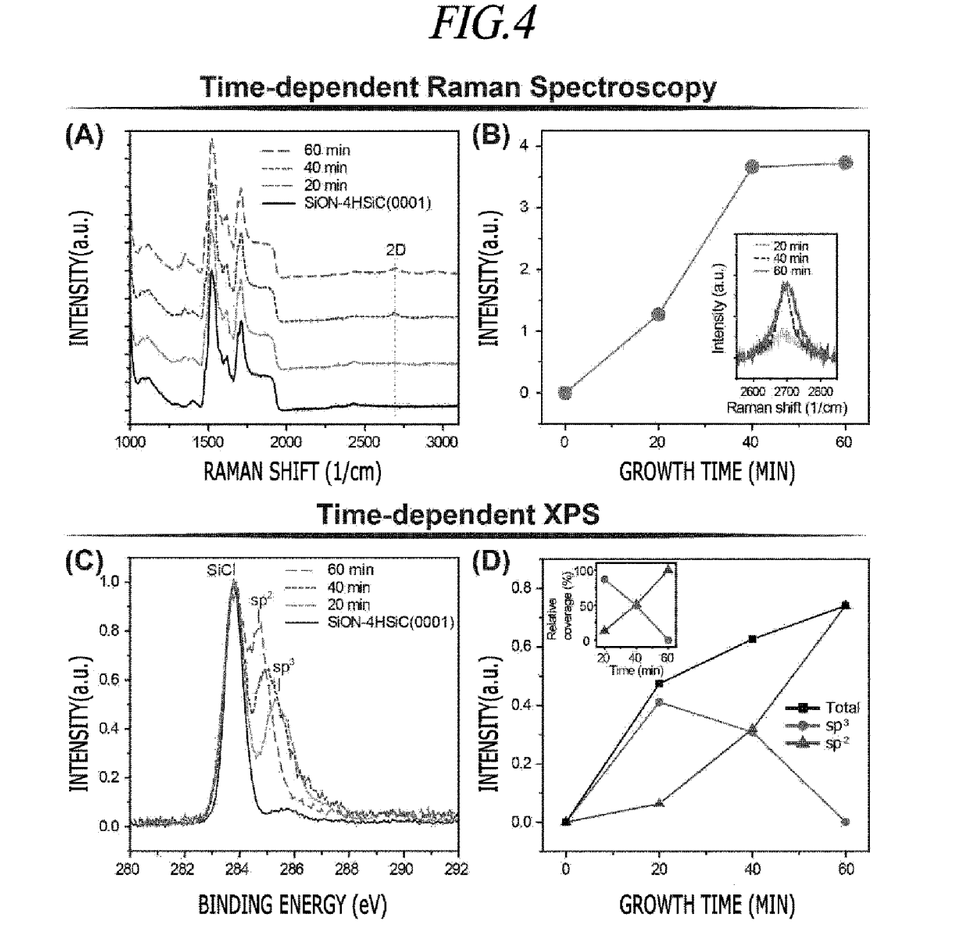
Figure 5:
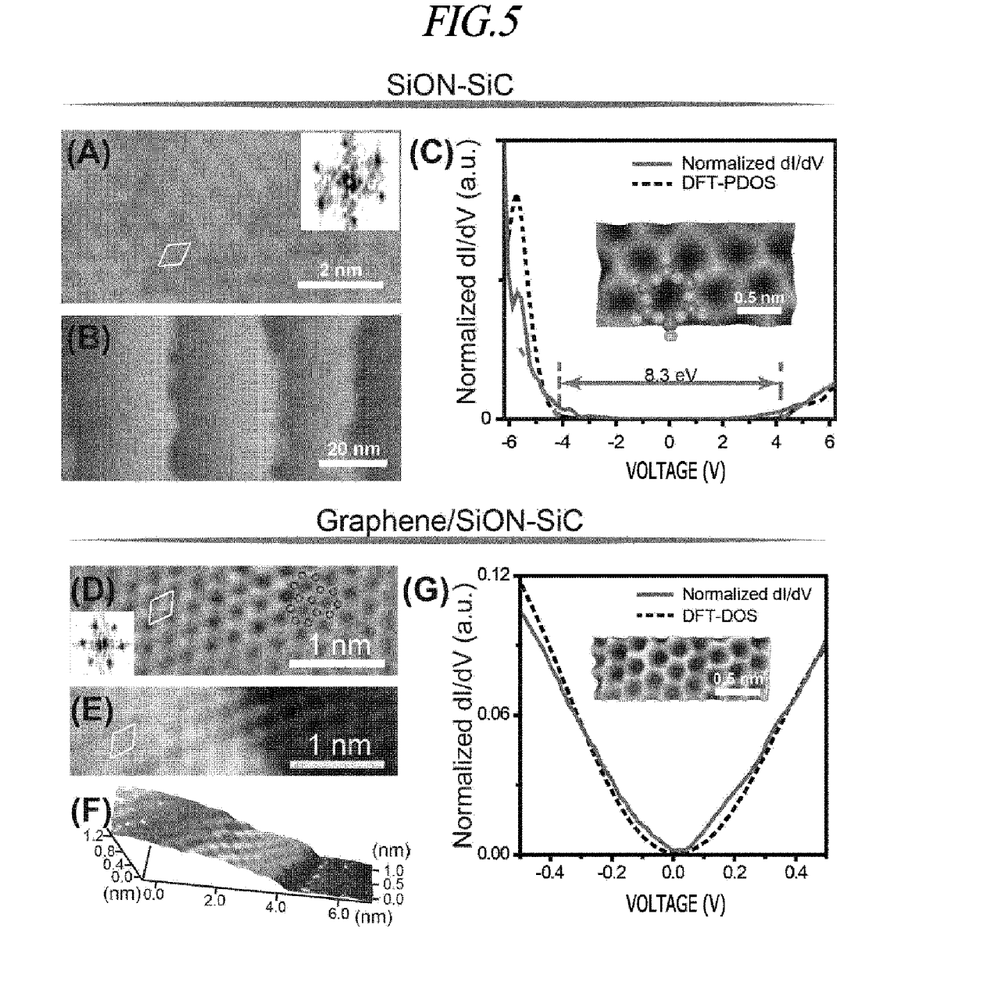

The properties of the prepared graphene in the example disclosed above are shown in FIG. 3 to FIG. 5.

(A) of FIG. 3 is an example of a growth diagram of prepared graphene. (B) of FIG. 3 is an example of a low energy electron diffraction (LEED) pattern showing the crystallinity on the surface of SiON—SiC before the graphene is grown. (C) of FIG. 3 is an example of an LEED pattern showing the crystallinity of graphene grown on the SiON—SiC. (D) of FIG. 3 is an example of a structure of the surface of the SiON—SiC. (E) of FIG. 3 is an example of a structure of the surfaces of the SiON—SiC and the graphene. (F) and (G) of FIG. 3 are examples of lateral structures before and after the graphene is grown, respectively.

(B) and (C) of FIG. 3 are photos of atomic force microscopy (AFM) images of graphene before and after growth, respectively.

According to the results shown in (F) and (G) of FIG. 3, the graphene is not bound and grown on the SiON—SiC substrate but connected thereto by Van der Waals interaction force. Since the graphene was grown by weak Van der Waals interaction force, a Moire pattern did not appear as shown in (B) to (E) of FIG. 3.

(A) and (B) of FIG. 4 are examples of Raman spectra graphs of prepared graphene. (C) and (D) of FIG. 4 are examples of X-ray photoemission spectroscopy (XPS) graphs of prepared graphene.

(B) of FIG. 4 shows that the intensity of 2D peak (2690 $cm^{-1}$) of graphene shown in (A) of FIG. 4 increases as the growth time increases (20 minutes, 40 minutes and 60 minutes).

The graphs included in (C) and (D) of FIG. 4 show the proportion of $sp^2$ and $sp^3$.

According to the result shown in (C) of FIG. 4, $sp^2$ and $sp^3$ of carbon atoms in the graphene were 284.7 eV and 285.4 eV, respectively, and (D) of FIG. 4 shows the intensity of each peak depending on the growth time.

Specifically, when the growth time of the graphene is less than 40 minutes, the $sp^3$ peak is dominant, but after 40 minutes, the $sp^2$ peak is dominant. This means that $sp^3$ of a carbon source such as methane is converted into graphene and then grown.

(A) and (B) of FIG. 5 are examples of scanning tunneling microscopy (STM) images. (C) of FIG. 5 is an example of a scanning tunneling spectroscopy (STS) graph of an SiON—SiC substrate prepared. (D) to (F) of FIG. 5 are examples of STM images. (G) of FIG. 5 is example of an STS graph of graphene.

The photos included in (A) and (D) of FIG. 5 are fast Fourier transformation (FFT) images.

Black lines shown in the graphs of (C) and (G) of FIG. 5 indicate result values based on density functional theory (DFT). The experimental values of SiON—SiC and graphene were almost identical to the theoretical values (DFT values) thereof. This is because the graphene was monocrystalline and thus expressed the inherent properties of graphene.

According to the results shown in the STM images of (A) to (G) of FIG. 5, the same crystallinity (white unit cell) can be measured from different parts of the same sample. Also, the graphene having the same crystallinity was seen smoothly and uniformly even on an atomic-level stepped structure present in the surface of the substrate of (E) and (F) of FIG. 5, and it was verified that the graphene prepared in Example was monocrystalline.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

We claim:

1. A method for preparing graphene, comprising:
   forming a dielectric material having crystallinity,
   wherein the dielectric material includes silicon nitrogen oxide or surface hexagonal lattice silica; and
   applying heat treatment concurrently with a gaseous carbon source on the dielectric material to grow graphene.

2. The method for preparing graphene of claim 1,
   wherein the graphene is grown by direct growth based on the crystallinity on the dielectric material.

3. The method for preparing graphene of claim 1,
   wherein the dielectric material having crystallinity is formed on a substrate.

4. The method for preparing graphene of claim 3,
   wherein the substrate contains a material selected from the group consisting of silicon carbide, silicon, germanium, silicon germanium, InAs, AlAs, GaAs, InP, GaN, InGaAs, InAlAs, GaSb, AlSb, AlP, GaP and combinations thereof.

5. The method for preparing graphene of claim 3,
   wherein the process of forming the dielectric material having crystallinity is performed by exposing the substrate to a gas selected from the group consisting of hydrogen, nitrogen, oxygen, air, silicon and combinations thereof.

6. The method for preparing graphene of claim 3,
   wherein the process of forming the dielectric material having crystallinity is performed under a pressure of $10^{-9}$ Torr to 1,000 Torr.

7. The method for preparing graphene of claim 3,
   wherein the process of forming the dielectric material having crystallinity is performed at a temperature of 300° C. to 1,700° C.

8. The method for preparing graphene of claim 3, further comprising: supplying hydrogen to the substrate before the process of forming the dielectric material on the substrate.

9. The method for preparing graphene of claim 1,
   wherein the silicon nitrogen oxide includes SiON or $Si_2N_2O$.

10. The method for preparing graphene of claim 1,
    wherein the surface hexagonal lattice silica includes $Si_2O_5$ or $SiO_2$.

11. The method for preparing graphene of claim 1,
    wherein the gaseous carbon source includes a carbon-containing compound having 1 to 7 carbon atoms.

12. The method for preparing graphene of claim 11,
    wherein the gaseous carbon source includes a material selected from the group consisting of methane, ethane, ethylene, carbon monoxide, ethanol, acetylene, propane, propylene, butane, butadiene, pentane, pentene, cyclopentadiene, hexane, cyclohexane, benzene, toluene and combinations thereof.

13. The method for preparing graphene of claim 1,
    wherein the heat treatment is applied at a temperature of 300° C. to 1,700° C.

14. The method for preparing graphene of claim 1, further comprising: cooling a product of the heat treatment.

15. The method for preparing graphene of claim 1,
    wherein the graphene forms a graphene sheet.

16. The method for preparing graphene of claim 15,
    wherein the graphene sheet is monocrystalline.

17. The method for preparing graphene of claim 1, further comprising:
    a heat source for the heat treatment including Joule heating, induction heating, radiation heat, laser, infrared radiation, microwaves, plasma, ultraviolet radiation, surface Plasmon heating, and combinations thereof.

18. The method for preparing graphene of claim 1,
    wherein the constant speed is 0.1° C. per minute to 10° C. per minute.

* * * * *